United States Patent
Babich et al.

(10) Patent No.: US 7,648,820 B2
(45) Date of Patent: Jan. 19, 2010

(54) ANTIREFLECTIVE HARDMASK AND USES THEREOF

(75) Inventors: Katherina Babich, Chappaqua, NY (US); Elbert Huang, Tarrytown, NY (US); Arpan P. Mahorowala, Bronxville, NY (US); David R. Medeiros, Ossining, NY (US); Dirk Pfeiffer, Dobbs Ferry, NY (US); Karen Temple, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 88 days.

(21) Appl. No.: 11/614,799

(22) Filed: Dec. 21, 2006

(65) Prior Publication Data

US 2007/0105363 A1    May 10, 2007

Related U.S. Application Data

(62) Division of application No. 10/646,307, filed on Aug. 22, 2003, now Pat. No. 7,172,849.

(51) Int. Cl.
*G03F 7/20* (2006.01)
*G03F 7/30* (2006.01)
*G03F 7/36* (2006.01)
*G03F 7/09* (2006.01)
*G03C 1/825* (2006.01)

(52) U.S. Cl. .................. 430/313; 430/311; 430/317; 430/325; 430/326; 430/329; 430/942; 430/272.1
(58) Field of Classification Search .................. None
See application file for complete search history.

(56) References Cited

U.S. PATENT DOCUMENTS

| 4,339,305 A * | 7/1982 | Jones ..................... 216/18 |
| 5,001,076 A * | 3/1991 | Mikkelson ............... 438/174 |
| 6,440,642 B1 * | 8/2002 | Shelnut et al. .......... 430/315 |
| 2003/0017635 A1 * | 1/2003 | Apen et al. .............. 438/29 |
| 2004/0087153 A1 * | 5/2004 | Du et al. ................. 438/689 |

\* cited by examiner

*Primary Examiner*—Sin J. Lee
(74) *Attorney, Agent, or Firm*—Ryan, Mason & Lewis, LLC (57) ABSTRACT

Antireflective hardmask compositions and techniques for the use of antireflective hardmask compositions for processing of semiconductor devices are provided. In one aspect of the invention, an antireflective hardmask layer for lithography is provided. The antireflective hardmask layer comprises a carbosilane polymer backbone comprising at least one chromophore moiety and at least one transparent moiety; and a crosslinking component. In another aspect of the invention, a method for processing a semiconductor device is provided. The method comprises the steps of: providing a material layer on a substrate; forming an antireflective hardmask layer over the material layer. The antireflective hardmask layer comprises a carbosilane polymer backbone comprising at least one chromophore moiety and at least one transparent moiety; and a crosslinking component.

11 Claims, 1 Drawing Sheet

FIG. 1

ANTIREFLECTIVE HARDMASK AND USES THEREOF

CROSS REFERENCE TO RELATED APPLICATIONS

This application is a divisional of U.S. patent application Ser. No. 10/646,307, filed on Aug. 22, 2003 now U.S. Pat. No. 7,172,849, incorporated by reference herein.

FIELD OF THE INVENTION

The present invention relates to semiconductor devices and, more particularly, to antireflective hardmask compositions and techniques for use of antireflective hardmask compositions for processing semiconductor devices.

BACKGROUND OF THE INVENTION

In the microelectronics industry, as well as in other industries involving construction of microscopic structures, e.g., micromachines and magnetoresistive heads, there is a desire to further reduce the size of structural features. In the microelectronics industry in particular, while the size of microelectronic devices is being reduced, a greater amount of circuitry for a given chip size is being required.

Effective lithographic techniques are essential to reducing the size of structural features. Lithography impacts the manufacture of microscopic structures, not only in terms of directly imaging patterns on the desired substrate, but also in terms of making masks typically used in such imaging.

Most lithographic processes use an antireflective coating (ARC) to minimize the reflectivity between an imaging layer, such as a radiation-sensitive resist material layer, and an underlayer to enhance resolution. However, these ARC materials impart poor etch selectivity to the imaging layer due to the layers' similar elemental compositions. Therefore, during etching of the ARC after patterning, a lot of the imaging layer is also consumed, which may have been needed for additional patterning during subsequent etch steps.

In addition, for some lithographic techniques, the radiation-sensitive resist material employed does not provide resistance to subsequent etching steps sufficient enough to enable effective transfer of the desired pattern to the layer underlying the radiation-sensitive resist material. In many instances, a hardmask layer is used for example, where an ultrathin radiation-sensitive resist material is used, where the underlying layer to be etched is thick, where a substantial etching depth is required, where it is desirable to use certain etchants for a given underlying layer, or any combination of the above. The hardmask layer serves as an intermediate layer between the patterned radiation-sensitive resist material and the underlying layer to be patterned. The hardmask layer receives the pattern from the patterned radiation-sensitive resist material layer and transfers the pattern to the underlying layer. The hardmask layer should be able to withstand the etching processes required to transfer the pattern.

While many materials useful as ARC compositions are known, there is a need for improved ARC compositions with high etch selectivity to the radiation-sensitive resist material, to the hardmask layer and to the underlying layer. Further, many of the known ARCs are difficult to apply to the substrate, e.g., applying these ARCs may require the use of chemical vapor deposition, physical vapor deposition, special solvents, high temperature baking or any combination of the above.

Thus, it would be desirable to be able to perform lithographic techniques with high etch selectivity yet sufficient resistance to multiple etchings. Such lithographic techniques would enable production of highly detailed semiconductor devices.

SUMMARY OF THE INVENTION

The present invention provides antireflective hardmask compositions and techniques for the use of antireflective hardmask compositions for processing of semiconductor devices. In one aspect of the invention, an antireflective hardmask layer for lithography is provided. The antireflective hardmask layer comprises a carbosilane polymer backbone comprising at least one chromophore moiety and at least one transparent moiety; and a crosslinking component. The carbosilane polymer may comprise any combination of an acid generator, an SiO-containing unit and an additional crosslinking component.

In another aspect of the invention, a method for processing a semiconductor device is provided. The method comprises the steps of: providing a material layer on a substrate; forming an antireflective hardmask layer over the material layer. The antireflective hardmask layer comprises a carbosilane polymer backbone comprising at least one chromophore moiety and at least one transparent moiety; and a crosslinking component. The method may further comprise the steps of: forming a radiation-sensitive imaging layer over the antireflective layer; patternwise exposing the radiation-sensitive imaging layer to radiation thereby creating a pattern of radiation-exposed regions in the imaging layer; selectively removing portions of the radiation-sensitive imaging layer and the antireflective hardmask layer to expose portions of the material layer; and etching the exposed portions of the material layer, thereby forming a patterned material feature on the substrate.

A more complete understanding of the present invention, as well as further features and advantages of the present invention, will be obtained by reference to the following detailed description and drawing.

DETAILED DESCRIPTION OF PREFERRED EMBODIMENTS

A lithographic structure comprising an antireflective hardmask composition (hereinafter "the composition") is disclosed herein. The composition comprises a carbosilane polymer backbone, comprising carbosilane units, of the general formula 1:

wherein $n \geq 1$, $x \geq 1$, and each R group is either a chromophore moiety, a transparent moiety or a crosslinking component.

The carbosilane polymer backbone typically comprises saturated carbon to carbon bonds, however, unsaturated carbon to carbon bonds may be introduced into the carbosilane polymer backbone. The introduction of unsaturated carbon to carbon bonds into the carbosilane polymer backbone will be described below.

The carbosilane polymer backbone may further comprise SiO-containing units, wherein SiO comprises any one of $\{R_2SiO\}$, $\{RSiO_{1.5}\}$ and $\{SiO_2\}$, wherein R is an organic group. Exemplary carbosilane polymer backbones comprising SiO-containing units may be represented as follows:

wherein $x \geq 1$, $y \geq 1$ and each R group is a chromophore moiety, a transparent moiety or a crosslinking component. It is to be under stood that the term "polymer," as used herein, refers generally to both carbosilane polymer backbones comprising carbosilane units and carbosilane polymer backbones comprising carbosilane units and SiO-containing units.

In an exemplary embodiment wherein the carbosilane polymer backbone comprises SiO-containing units, the composition has more carbosilane units than SiO-containing units to ensure proper hardmask properties of the composition (especially when any one of the underlayers comprises an oxide). The SiO-containing units may be chosen from siloxane building blocks. The antireflective hardmask layer should have solution and film-forming characteristics conducive to layer formation by conventional spin-coating.

The introduction of unsaturated carbon to carbon bonds into the composition, e.g., $\{R_2Si\{(CH)_2\}_n\}_y$ or $\{R_2Si\{(C)_2\}_n\}_z$, wherein $n \geq 1$ and $x=0$; $y$, $z \geq 1$ or $x$, $y$, $z \geq 1$, may be desirable for some lithographic applications, especially those applications employing a wavelength of less than or equal to 157 nm. Some exemplary compositions having unsaturated carbon to carbon bonds have the following configurations:

The composition may comprise from about 50 weight percent (wt. %) to about 98 wt. %, on a solids basis, polymer. For example, the composition may comprise from about 70 wt % to about 80 wt. % polymer.

As mentioned above, each R group can be either a chromophore moiety, a transparent moiety, or a crosslinking component. The carbosilane polymer backbone itself is generally transparent to most wavelengths employed. However, the introduction of fluorine-containing moieties or SiO-containing units, which are substantially transparent to the imaging radiation, may be desirable. In some instances, multiple moieties and/or crosslinking components may be present on the same carbosilane or SiO-containing unit. For example, a crosslinking component and a chromophore moiety may be present on the same carbosilane unit.

The chromophore moiety may comprise any suitable chromophore moiety which can be grafted onto the carbosilane or SiO-containing units with suitable radiation absorption characteristics and does not adversely affect the performance of either the antireflective hardmask composition, or any overlying radiation-sensitive layers. Suitable chromophore moieties include, but are not limited to, phenyl, chrysenes, pyrenes, fluoranthrenes, anthrones, benzophenones, thioxanthones, and anthracenes. Anthracene derivatives, for example those described in Renner, U.S. Pat. No. 4,371,605 "Photopolymerizable Compositions Containing N-hydroxyamide and N-hydroxyimide Sulfonates," the disclosure of which is incorporated by reference herein, may also be used (e.g., 9-Anthracene methanol is a preferred chromophore for 248 nanometer (nm) lithography). The chromophore moiety preferably does not contain nitrogen, except for possibly deactivated amino nitrogen such as in phenol thiazine. For 193 nm lithography, non-aromatic compounds containing unsaturated carbon bonds, e.g., carbon to carbon double bonds, are also suitable chromophores. Highly crosslinked carbosilanes can have suitable optical properties at 193 nm without the addition of a chromophore. For 157 nm lithography, compounds containing saturated carbon to carbon bonds can act as chromophores.

The chromophore moieties may be chemically attached to the carbosilane or SiO-containing units by acid-catalyzed O-alkylation or C-alkylation, such as by Friedel-Crafts alkylation. Alternatively, the chromophore moiety may be attached to the carbosilane or SiO-containing units by an esterification mechanism. In an exemplary embodiment, from about one percent to about 40 percent of the carbosilane and SiO-containing units contain chromophore moieties. The site for attachment of the chromophore moieties on the carbosilane or SiO-containing units can be an aromatic group, such as a hydroxybenzyl or hydroxymethylbenzyl group. Alternatively, the chromophore moieties may be attached to the carbosilane units through reaction with other moieties that are present, such as alcohols. The reaction used to attach the chromophore moieties to the carbosilane or SiO-containing units preferably comprises esterification of an alcohol (—OH) group.

The transparent moieties may vary depending on the wavelength or character of the imaging radiation used. In the case of 193 or 157 nm lithography, the transparent moieties used are generally organic moieties flee of unsaturated carbon to carbon bonds. To achieve desirable optical properties fox the composition, less than or equal to about 50 percent of the transparent moieties should contain unsaturated carbon to carbon bonds, especially in the case of 193 nm lithography. In the case of 157 nm lithography, the transparent moieties may contain fluorocarbon substituents to enhance transparency. Further, the formation of polymers comprising a mixture of carbosilane and SiO-containing units may be desirable to achieve optical transparency for 193 nm and 157 nm lithography. It may be desirable to balance the number of transparent moieties and chromophore moieties to provide favorable combinations of energy absorption and antireflection.

The composition further comprises a crosslinking component. The crosslinking component may act, with or without an additional crosslinking component, to crosslink carbosilane polymers within the composition. The crosslinking reaction may be catalyzed by the generation of an acid, by heating, or both, or alternatively, by election beam irradiation.

The crosslinking component comprises any suitable crosslinking group known in the negative photoresist art which is compatible with other components of the composition. The crosslinking component may act to crosslink the polymers in the presence of a generated acid. An acid generator will be described in detail below.

Suitable crosslinking components include, but are not limited to, glycoluril, alcohols, aromatic alcohols, hydroxybenzyl, phenol, hydroxymethylbenzyl for 248 nm lithography cycloaliphatic alcohols, aliphatic alcohols, cyclohexanoyl, propanol, non-cyclic alcohols, fluorocarbon alcohols, and compositions comprising at least one of the foregoing alcohols. Aromatic alcohols are suitable for 248 nm lithography.

Examples of Polycarbosilanes

Cycloaliphatic and aliphatic alcohols are suitable for 193 nm lithography. Further suitable crosslinking components include vinyl ethers and epoxides.

The crosslinking component may also comprise a silicon hydrogen bond, vinyl or allyl groups or alkoxy substituents attached to silicon. Examples of crosslinkable carbosilanes and examples of R groups, e.g., of general formula 1, as part of a crosslinking component are shown below:

According to the teachings of the present invention, the composition may comprise from about one wt. % to about 50 wt %, on a solids basis, crosslinking component. For example, the composition may comprise from about three wt % to about 25 wt. %, on a solids basis, crosslinking component.

Generally, the crosslinking component can be attached to the carbosilane and SiO-containing units by a hydrosilation reaction before, or after, the formation of the polymer. The crosslinking component can also be introduced to the carbosilane and SiO-containing units by a substitution reaction of a silicon halogen bond with Grignard or organo lithium reagents. This substitution reaction may be performed before, or after, formation of the polymer. Examples of hydrosilation reactions I and II, reactions of silicon halogen bond with organometallic reagents III, and various polymerization reactions IV, all involving carbosilanes and polysiloxanes, are shown in the scheme below:

IV

R = Chromophore, transparent group,

A detailed description of the above examples may be found, for example, in R. D. ARCHER, INORGANIC AND ORGANOMETALLIC POLYMERS, 54, 76 (2001); M. A. BROOK, SILICON IN ORGANIC, ORGANOMETALLIC, AND POLYMER CHEMISTRY, 256-367, 400 (2000); M. Birot et al., *Comprehensive Chemistry of Polycarbosilane, Polysilazene, and Polycarbosilazene as Precursors for Ceramics*, 95 J. CHEM. REV. 1443 (1995); L. V. Interrante et al, *Linear and Hyperbranched Polycarbosilanes with Si—CH$_2$—Si Bridging Groups A Synthetic Platform for the Construction of Novel Functional Polymeric Materials*, 12 APPL. ORGANOMETAL. CHEM. 695 (1998); 210 H. FREY ET AL., TOPICS IN CURRENT CHEMISTRY, 101 (2000); E. D. Babich, *Silacyclobutanes and Related Compounds (Ring-Opening Polymerization)*, 10 POLYMERIC MATERIALS ENCYCLOPEDIA 7621-35 (1996), the disclosures of which are incorporated by reference herein.

The carbosilane polymer comprising either carbosilane units, or a mixture of carbosilane and SiO-containing units, has a weight average molecular weight, before reaction with any crosslinking component, of greater than or equal to about 500. For example, the carbosilane polymer may have a weight average molecular weight of from about 1,000 to about 10,000.

The composition may comprise an additional crosslinking component. The additional crosslinking component preferably comprises a compound that can be reacted with the carbosilane polymer in a manner which is catalyzed by a generated acid, and also possibly by heating. Generally, the additional crosslinking component may comprise any additional crosslinking agent known in the negative photoresist art which is compatible with the other components of the composition. Suitable additional crosslinking agents include, hut are not limited to, glycoluril compounds including methylated glycolurils, butylated glycolurils, tetramethoxymethyl glycoluril, methylpropyltetramethoxymethyl glycoluril, methylphenyltetramethoxymethyl glycoluril, 2,6-bis(hydroxymethyl)-p-cresol compounds, etherified amino resins including methylated melamine resins, N-methoxymethylmelamine, butylated melamine resins, N-butoxymethylmelamine, bis-epoxies, bis-phenols, bisphenol-A and compositions comprising at least one of the foregoing additional crosslinking agents.

Suitable glycoluril compounds include POWDERLINK™ compounds, a trademark of Cytec industries. Suitable 2,6-bis (hydroxymethyl)-p-cresol compounds include those described in Masaaki, Japanese Patent Application JP1293339A2 "Photoresist Compositions," the disclosure of which is incorporated by reference herein. Suitable methylated glycolurils and butylated glycolurils include those described in Kirchmayr, Canadian Patent 1204547, "Curable Composition Based On an Acid-Curable Resin, and Process for Curing this Resin," the disclosure of which is incorporated by reference herein.

The composition may further comprise an acid generator. The acid generator comprises an acid generating group that liberates acid upon thermal treatment (a thermal acid generator). A variety of known thermal acid generators may be used, including, but not limited to, 2,4,4,6-tetrabromocyclohexadienone, benzoin tosylate, 2-nitrobenzyl tosylate, other alkyl esters of organic sulfonic acids and compositions comprising at least one of the foregoing thermal acid generators. Compounds that generate a sulfonic acid upon activation are generally suitable and include the thermally activated acid generators described in Sinta et al, U.S. Pat. No. 5,886,102 "Antireflective Coating Compositions" (hereinafter "Sinta") and in Pavelchek et al, U.S. Pat. No. 5,939,236 "Antireflective Coating Compositions Comprising Photoacid Generators," (hereinafter "Pavelchek"), the disclosures of which are incorporated by reference herein.

A radiation-sensitive acid generator may be employed as an alternative to, or in combination with, the thermal acid generator. Radiation-sensitive acid generators generally known in the resist art may be used, as long as they are compatible with the components of the composition. Suitable radiation-sensitive acid generators include those described in Sinta and Pavelchek.

When a radiation-sensitive acid generator is used, the crosslinking temperature may be reduced by the application of radiation to induce acid generation, which in turn catalyzes the crosslinking reaction. Even if a radiation-sensitive acid generator is used, the composition may be thermally treated to accelerate the crosslinking process. It may be advantageous to accelerate the crosslinking process, for example, in the case of production line fabrication.

The composition may comprise from about one wt. % to about 20 wt. %, on a solids basis, acid generator. For example, the composition may comprise from about one wt. % to about 15 wt. %, on a solids basis, acid generator.

In some cases, crosslinking may be achieved by baking in a forming gas atmosphere without either one, or both of an acid generator or an additional crosslinker. In the case where an acid generator is not used, crosslinking is accomplished with electron beam radiation instead of heating.

The composition may be used in combination with any desired resist material to form a lithographic structure. In an exemplary embodiment, the resist material is imageable with shorter wavelength ultraviolet radiation, fox example, with a wavelength on the order of less than 248 nm, or with electron beam radiation. Suitable resist materials are described, for example, in Bucchignano et al., U.S. Pat. No. 6,037,097, "E-beam Application to Mask Making Using New Improved KRS Resist System," the disclosure of which is incorporated by reference herein.

The composition typically comprises a solvent prior to application to a desired substrate. Suitable solvents include solvents conventionally used with resist materials and which do not have an excessively adverse impact on the performance of the composition. Exemplary solvents include, but are not limited to, propylene glycol monomethyl ether acetate, cyclohexanone and ethyl lactate.

The solvent should be present in the composition in an amount sufficient to achieve a solids content of about five wt. % to about 20 wt. %. Higher solids content formulations will generally yield thicker coating layers. The composition of the present invention may further contain minor amounts of auxiliary components, e.g., base additives, as are known in the art.

The compositions provided herein have an adequate shelf-life. Further, the compositions provided herein prevent adverse interactions with the imaging layer, e.g., by acid contamination from the hardmask layer.

The composition can be prepared by combining the carbosilane polymer, crosslinking component and acid generator, as well as any other desired ingredients using conventional methods. The formation of an antireflective hardmask layer using the composition is described below.

The composition is especially useful in conjunction with the lithographic processes used to manufacture semiconductor devices, e.g., lithographic processes employing 193 nm, 157 nm, x-ray, electron beam or other imaging radiation. Thus, further disclosed herein is a method for processing a semiconductor device, as shown in FIG. 1.

Figure 1:
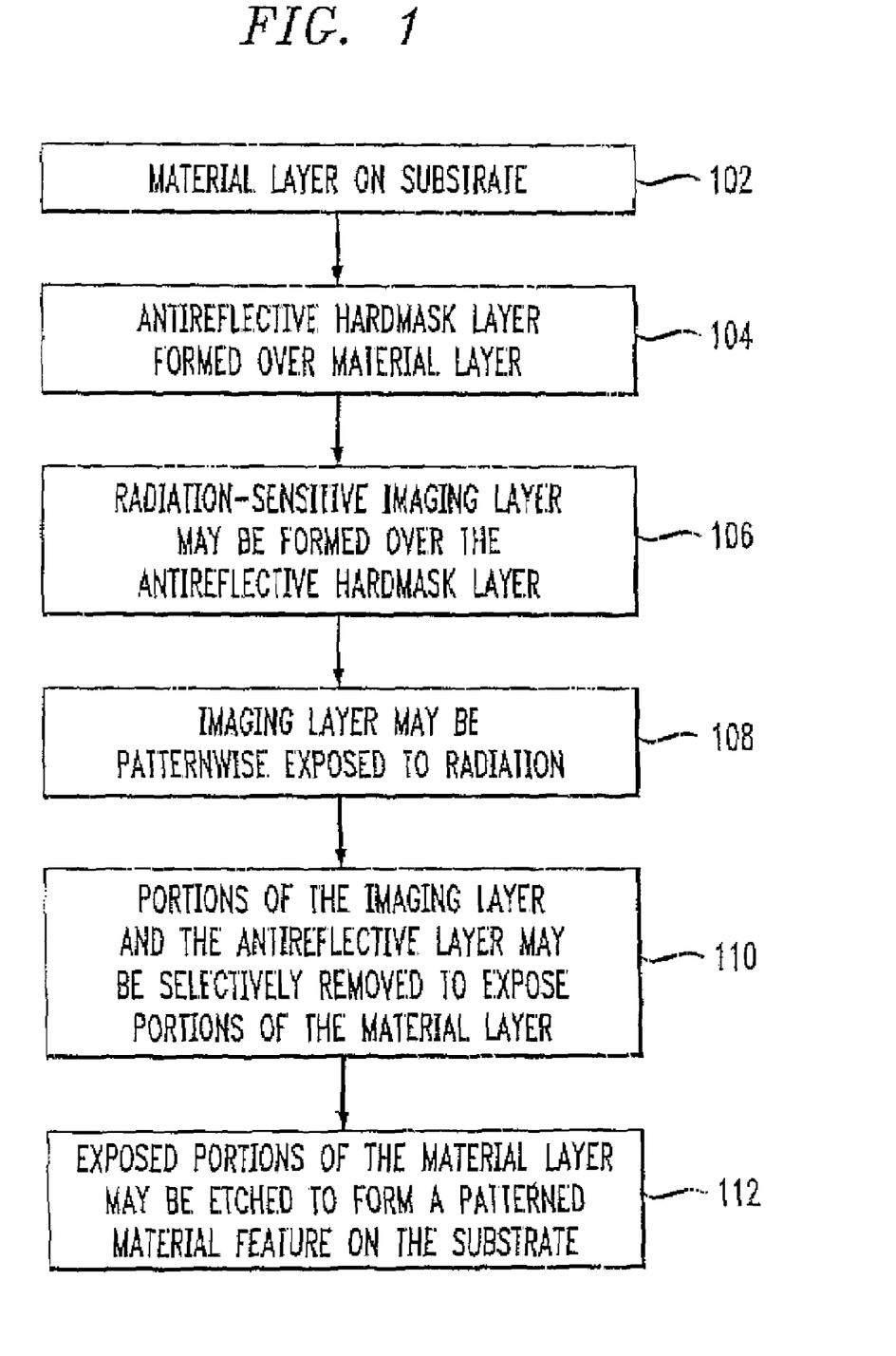
FIG. 1 is a flow chart illustrating an exemplary technique for processing a semiconductor device according to an embodiment of the present invention.

Semiconductor lithographic applications generally involve the transfer of a pattern to a material layer provided on a semiconductor substrate, as shown in step 102 of FIG. 1. The material layer may be a conductive material, a semiconductive material, a magnetic material, an insulative material, a metal, a dielectric material or a combination comprising at least one of the foregoing materials, depending on the stage of the manufacture process and the material desired for the end product.

The composition of the present invention may be formed into an antireflective hardmask layer over the material layer by spin-coating, as shown in step 104 of FIG. 1, followed by baking, to achieve crosslinking and solvent removal. In an exemplary embodiment, baking is conducted at a temperature of less than or equal to about 250 degrees centigrade (° C.). For example, baking may be conducted at a temperature of from about 150° C. to about 220° C. The duration of baking may vary depending on the thickness of the layers and baking temperature.

In a further exemplary embodiment, baking may be conducted in a forming gas atmosphere at a temperature of from about 250° C. to about 400° C. In an alternate embodiment, baking is substituted by electron beam radiation.

The thickness of the antireflective hardmask layers formed from the composition may vary depending on the desired function. For typical applications, the thickness of the antireflective hardmask layer is from about 0.03 micrometers (μm) to about five μm.

The antireflective hardmask layers may be used as a dielectric material in a manner similar to conventional spin-on glass materials. The antireflective hardmask layers resist lateral etch and may serve as a hardmask layer even at thicknesses generally associated with organic antireflective layers.

The antireflective hardmask layer is preferably applied directly over the material layer to be patterned. A radiation-sensitive imaging layer can then be formed, either directly or indirectly, over the antireflective hardmask layer, as shown in step 106 of FIG. 1.

The radiation-sensitive imaging layer may be applied using spin-coating techniques. The substrate with the material layer, the antireflective hardmask layer and the radiation-sensitive imaging layer may then be heated, i.e., pre-exposure baked, to remove solvent and improve the coherence of the radiation-sensitive imaging layer. The radiation-sensitive imaging layer should be as thin as possible while still being substantially uniform and sufficient to withstand subsequent processing, such as reactive ion etching, to transfer the lithographic pattern to the underlying material layer. The duration of the pre-exposure bake may be from about ten seconds to about 900 seconds. For example, the duration of the pre-exposure bake may be from about 15 seconds to about 60 seconds. The pre-exposure bake temperature may vary depending on the glass transition temperature of the radiation-sensitive imaging layer.

After solvent removal, the radiation-sensitive imaging layer is then patternwise exposed to the desired radiation, for example, ultraviolet radiation having a wavelength less than or equal to about 200 mm, i.e., 193 mm ultraviolet radiation, as shown in step 108 of FIG. 1. When scanning particle beams, such as an electron beam, are used, patternwise exposure may be achieved by scanning the particle beam across the semiconductor device and selectively applying the particle beam according to the desired pattern. However, typically, when wavelike radiation, such as 193 nm ultraviolet radiation, is used, the patternwise exposure is conducted through a mask which is placed over the radiation-sensitive imaging layer. The total exposure energy for 193 nm ultraviolet radiation may be less than or equal to about 100 millijoules per square centimeter (millijoules/cm$^2$). For example, the total exposure energy may be less than or equal to about 50 millijoules/cm$^2$, such as between about 15 millijoules/cm$^2$ to about 30 millijoules/cm$^2$.

After patternwise exposure, the radiation-sensitive imaging layer is typically baked, e.g., post-exposure baked, to further complete the acid-catalyzed reaction and to enhance the contrast of the exposed pattern. The post-exposure bake is conducted at a temperature of from about 60° C. to about 175° C. For example, the post-exposure bake may be conducted at a temperature of from about 90° C. to about 160° C. The post-exposure bake is preferably conducted for a duration of from about 30 seconds to about 300 seconds.

After the post-exposure bake, the radiation-sensitive imaging layer with the desired pattern is obtained, e.g., developed, by contacting the radiation-sensitive imaging layer with an alkaline solution which selectively dissolves and removes the areas of the radiation-sensitive imaging layer which were exposed to the radiation, as shown in step 110 of FIG. 1. Suitable alkaline solutions, e.g., developers, include aqueous solutions of tetramethyl ammonium hydroxide. The resulting lithographic structure is then typically dried to remove any remaining solvent from the developers.

The desired pattern from the radiation-sensitive imaging layer may then be transferred to the exposed portions of the antireflective hardmask layer by etching with tetrafluoromethane ($CF_4$), or other suitable etchant, using known techniques. The portions of the antireflective hardmask layer may then be removed, as shown in step 110 of FIG. 1.

The exposed underlying material layer to be patterned may then be etched, as shown in step 112 of FIG. 1, using an etchant appropriate to that material. For example, when the material layer comprises a metal such as chromium (Cr) a chlorine/oxygen combination ($Cl_2/O_2$) may be used as a dry etchant.

Once the pattern has been transferred to the underlying material layer, any remaining radiation-sensitive imaging layer and antireflective hardmask layer may be removed using conventional stripping techniques. If the antireflective hardmask layer is being used strictly as a hardmask layer, the composition may be removed using a tetrafluoromethane/oxygen ($CF_4/O_2$) plasma.

The antireflective hardmask and resulting lithographic structure can be used to form patterned features on the substrate, such as metal wiring lines, holes for contacts or vias, insulation sections, including damascene trenches or shallow trench isolation trenches for capacitor structures, and any other like structures that might be used in the design of integrated circuit devices. The teachings herein ace useful in creating patterned material layers of oxides, nitrides, polysilicons or chrome.

Examples of general lithographic processes wherein the composition of the present invention may be useful are disclosed in Douglas, U.S. Pat. No. 4,855,017, "Trench Etch Process for a Single-Wafer RIE Dry Etch Reactor," Bronner et al, U.S. Pat. No. 5,362,663, "Method of Forming Double Well Substrate Plate Trench DRAM Cell Array," Akiba et al., U.S. Pat. No. 5,429,710, "Dry Etching Method," Nulty, U.S. Pat. No. 5,562,801, "Method of Etching an Oxide Layer," Golden et al., U.S. Pat. No. 5,618,751, "Method of Making Single-Step Trenches Using Resist Fill Recess," Chan et al, U.S. Pat. No. 5,744,376, "Method of Manufacturing Copper Interconnect With Top Barrier Layer," Yew et al., U.S. Pat. No. 5,801,094, "Dual Damascene Process," Kornblit, U.S. Pat. No. 5,948,570, "Process for Dry Lithographic Etching," the disclosures of which are incorporated by reference herein. Other examples of pattern transfer processes are described in W. MOREAU, SEMICONDUCTOR LITHOGRAPHY, PRINCIPLES, PRACTICES, AND MATERIALS, ch. 12-13 (1988), the disclosure of which is incorporated by reference herein. While exemplary lithographic processes are described and referenced herein, it should be understood that the present invention should not limited to any particular lithographic technique or device structure.

Further disclosed herein is a patterned lithographic structure. The patterned lithographic structure comprises: a substrate; a material layer over the substrate; a patterned antireflective hardmask layer over the material layer, the patterned antireflective hardmask layer comprising the composition; and a patterned radiation-sensitive imaging layer over the antireflective hardmask layer.

Although illustrative embodiments of the present invention have been described herein, it is to be understood that the invention is not limited to those precise embodiments, and that various other changes and modifications may be made by one skilled in the art without departing from the scope or spirit of the invention. The following examples are provided to illustrate the scope and spirit of the present invention. Because these examples are given for illustrative purposes only, the invention embodied therein should not be limited thereto.

EXAMPLES

Example 1

An antireflective hardmask layer was formulated comprising Polyhydridocarbosilane-co-Allylhydridocarbosilane with ten percent allyl (AHPCS), and Dimethoxypolycarbosilane (DMPCS) obtained from Starfire Systems, Watervliet, N.Y. Polycarbomethylsilane, glycidoxypropyltrimethoxysilane and phenyltrimethoxysilane were obtained from Aldrich Chemical Company, Inc.

Example 2

Formulation A

Film Formation

The polymer AHPCS was dissolved in 2-heptanone solvent at a concentration of about ten wt % to about 20 wt %, on a solids basis, relative to the solvent. A film with a thickness of about 200 nm to about 400 nm was generated by spin coating Formulation A onto a 200 millimeter (mm) silicon wafer at 3000 revolutions per minute (rpm) for 60 seconds, followed by a hot plate bake at 200° C. for five minutes under an inert nitrogen flow, and a furnace cure at 400° C. for one hour under an inert nitrogen flow. Rutherford backscattering spectrometry (RBS) analysis of the carbosilane polymer film cured at 200° C. showed the following elemental composition: silicon 23.9±2 atomic percent; carbon 25.9±3 atomic percent; hydrogen 44.9±2 atomic percent; oxygen 5.3±3 atomic percent. RBS analysis of the polycarbosilane polymer film cured at 400° C. showed the following elemental composition: silicon 22.5±2 atomic percent; carbon 29.7±3 atomic percent; 40.0±2 atomic percent; oxygen 7.8±3 atomic percent.

Example 3

Formulation B

Film Formation

The polymer polycarbomethylsilane was dissolved in 2-heptanone solvent at a concentration of about ten wt. % to about 20 wt. %, on a solids basis, relative to the solvent. A film with a thickness of about 200 nm to about 400 nm was generated by spin coating Formulation B onto a 200 mm silicon wafer at 3000 rpm for 60 seconds, followed by a hot plate bake at 200° C. for five minutes under an inert nitrogen flow. The film was then electron beam cured by exposure using a ElectronCure™—200M tool from the AlliedSignal Election Vision Group. The exposure was done with two milliamps (mA) at 25 kilovolts (kV) for approximately 20 minutes. The dose is exactly at 2000 microcoulombs per square centimeter ($\mu C/cm^2$) for each wafer. The maximum dose on this tool is 250 (microcoulombs) $\mu C$ each time. It was exposed eight times with 250 $\mu C$ each.

Example 4

Formulation C

Film Formation

The polymer DMPCS was dissolved in PGMEA solvent at a concentration of 20 wt. % relative to the solvent. The thermal acid generator, nitrobenzylbutyltosylate, was added at a concentration of five wt. % relative to the polymer. A film with a thickness of 200 nm was generated by spin coating the formulation onto a 200 mm silicon wafer at 3000 rpm for 60 seconds, followed by a hot plate bake at 200° C. for two minutes Example 5

Formulation D

The precursors dimethoxypolycarbosilane (DMPCS), glycidoxypropyltrimethoxysilane and phenyltrimethoxysilane were mixed in a molar ratio of 0.45 to 0.45 to 0.1, respectively. A total of one gram (g) of this mixture was dissolved in four g of Dowanol PM (a product of Aldrich Chemical Company, Inc.) and one g of one normal (n) hydrochloric acid. This solution was stirred for one hour and filtered. A film with a thickness of 300 nm was generated by spin coating this formulation onto a 200 millimeters (mm) silicon wafer at 3000 rpm fox 60 seconds, followed by a hot plate bake at 200° C. for two minutes. RBS analysis of the silsesquioxane/carbosilane copolymer film showed the following elemental composition: silicon 11.7±2 atomic percent; oxygen 19.8±2 atomic percent; carbon 27.7±2 atomic percent; hydrogen 40.1±2 atomic percent; chlorine 0.7±0.2 atomic percent.

Example 6

Optical Properties

The optical constants (index of refraction (n) and extinction coefficient (k) at 193 nm) are measured using an n&k Analyzer manufactured by n&k Technology, Inc.

The optical properties of the films for 193 nm radiation were as follows:

| Film Polymer | n | k |
| --- | --- | --- |
| Formulation A | 1.922 | 0.414 |
| Formulation B | 1.726 | 0.39 |
| Formulation C | 1.67 | 0.007 |
| Formulation D | 1.909 | 0.247 |

The optical properties of the films for 157 nm radiation were as follows:

| Film Polymer | n | k |
| --- | --- | --- |
| Formulation C | 1.859 | 0.210 |

Example 7

193 nm Lithography and Etching the Antireflective Hardmask Layer

The antireflective hardmask layer, described in Example 1 and Example 4, was used for lithography. A layer of acrylic-based photoresist, a product of Sumitomo, JSR, was spin-coated over the cured antireflective hardmask layer to a thickness of about 250 nm. The radiation-sensitive imaging layer was baked at 130° C. for 60 seconds. The radiation-sensitive imaging layer was then imaged using a 0.6 NA 193 nm Nikon Stepper with conventional and annular illumination using APSM reticle. After patternwise exposure, the radiation-sensitive imaging layer was baked at 130° C. for 60 seconds. The image was then developed using a commercial developer (0.26M TMAH). The resulting pattern showed 113 75 nm and 122 5 nm lines and space patterns.

The pattern was then transferred into the antireflective hardmask layer by a 20 second fluorocarbon-based etch using a TEL DRM tool. The etch selectivity between the radiation-sensitive imaging layer and the hardmask layer exceeded three to one.

The etch selectivity between the films present between the antireflective hardmask layer and an oxide containing material layer was determined on the polymer films from Example 1 to be five to one and polymer films from Example 4 to be three to one, using a fluorocarbon-based oxide etch performed on a TEL DRM tool. The combined etch selectivities will give an overall etch selectivity of the pattern transfer from oxide to organic resist material greater than six to one.

Example 8

All of the following reactions were carried out under an inert atmosphere using standard Schlenk techniques Anhydrous toluene, allyl glycidyl ether and polycarbomethylsilane (MeH-PCS) were purchased from Aldrich Chemical Company, Inc., and used as received Karstedt's Catalyst was purchased from Gelest, Tullytown, Pa. while dimethyldisilacyclobutane (MeH-DSCB) was purchased from Starfire Systems, Watervliet, N.Y. Tetramethyldisilacyclobutane (Me$_2$-DSCB) was synthesized according to procedures obtainable commercially from Aldrich Chemical Company, Inc. The optical constants (index of refraction (n) and extinction coefficient (k) at 193 nm) are measured using an n&k Analyzer manufactured by n&k Technology, Inc.

Hydrosilylation of MeH-DSCB with Allyl Glycidyl Ether (AGE)

MeH-DSCB (2.95 g, 25.4 millimole (mmol)) and AGE (7.25 g, 623.6 mmol) was placed in a 50 milliliter (mL) Schlenk flask and degassed via two freeze/thaw cycles. Anhydrous toluene (15 mL) was added followed by the addition of ten microliters (μL) of Karstedt's Catalyst, and the reaction was stirred at room temperature for 18 hours. A couple of spatula tips of silica gel were added and the reaction continued stirring at room temperature for eight additional hours. Filtration, followed by the removal of volatile components under vacuum, afforded MeGP-DSCB (Methyl-Glycidoxypiopyldisilacyclobutane) (67 percent isolated yield). $^1$H NMR (400 megahertz (MHz), CDCl$_3$): 0.05 (m, 2H, Si(Me)(CH$_2$R) CH$_2$Si), 0.28 (m, 3H, Si(Me)(CH$_2$R)CH$_2$Si), 0.73 (m, 2H, Si(Me)(CH$_2$CH$_2$R)CH$_2$Si), 1.70 (m, 2H, Si(Me)(CH$_2$CH$_2$R) CH$_2$Si), 2.65 (m, 1H, GP), 2.83 (m, 1H, PGE), 3.19 (m, 1H, GP), 3.45 (br, 1H, GP), 3.78 (br, 1H, PGE).

Synthesis of Methyl-Glycidoxypropyl-Polycarbosilane (MeGP-PCS): Ring-Opening Polymerization of MeGP-DSCB MeGP-DSCB (1.00 g, 2.91 mmol) was placed in a Schlenk tube and degassed via two freeze/thaw cycles. Anhydrous toluene (15 mL) was added followed by the addition of five μL of Karstedt's Catalyst. Following a slight exotherm, the reaction was heated at 75° C. overnight. Precipitation in MeOH at −78° C. and removal of residual solvents afforded MeGP-PCS (50 percent isolated yield). $^1$H NMR (400 MHz, CDCl$_3$): −0.23 (m, Si(Me)(R)CH$_2$SiMe(R')), 0.11 (m, Si(Me)(R)CH$_2$SiMe(R')), 0.52 (m, Si(Me)(CH$_2$CH$_2$R) CH$_2$Si), 1.62 (m, Si(Me)(CH$_2$CH$_2$R)CH$_2$Si), 2.65 (m, GP), 2.83 (m, GP), 3.19 (m, PGE), 3.44 (br, GP), 3.78 (br, GP). Mn=3483, PDI=291.

Synthesis of (MeGP-co-Me₂)PCS: Copolymerization of Me₂-DSCB and MeGP-DSCB

MeGP-DSCB (0.5 g, 1.45 mmol) and Me₂-DSCB (0.21 g, 1.45 mmol) were placed in a Schlenk tube and degassed via two freeze/thaw cycles. Anhydrous toluene (15 mL) was added followed by the addition of five μL of Karstedt's Catalyst. Following a slight exotherm, the reaction was heated at 75° C. overnight Precipitation in MeOH at −78° C. and removal of residual solvents afforded (MeGP-co-Me₂)PCS as a viscous liquid (33 percent isolated yield). $^1$H NMR (400 MHz, CDCl$_3$): −0.23 (m, Si(Me)(R)CH$_2$SiMe(R')), 0.16 (m, Si(Me)(R)CH$_2$SiMe(R')), 0.55 (m, Si(Me)(CH$_2$CH$_2$R)CH$_2$Si), 1.65 (m, Si(Me)(CH$_2$CH$_2$R)CH$_2$Si), 2.65 (m, GP), 2.83 (m, GP), 3.19 (m, GP), 3.44 (br, GP), 3.77 (br, GP). Optical properties (193 nm): n=1.681, k=0.032.

Synthesis of Branched MeGP-PCS: Hydrosilylation of MeHPCS

MeHPCS (molecular weight (mw)=800, 2.00 g) and AGE (880 g, 772 mmol) were combined in a flask and degassed via two freeze/thaw cycles. Anhydrous toluene (15 mL) was added followed by the addition of H$_2$PtCl$_6$ (ca. five μL of a 0.1 molar (M) solution in iPrOH). The reaction was heated at 95° C. overnight. Precipitation into cold MeOH (−78° C.) followed by removal of the supernatant solvent affords the desired MeGP-PCS (68 percent, isolated yield, 18 percent grafting). $^1$H NMR (400 MHz, CDCl$_3$): 0.043-0.146 (br, Si(Me)(CH$_2$R)CH$_2$Si), 1.56 (br, 2H, Si(Me)(CH$_2$CH$_2$R)CH$_2$Si), 2.58 (br, 1H, GP), 2.77 (br, 1H, GP), 3.12 (br, 1H, GP), 3.39 (br, 1H, GP), 3.69 (br, 1H, GP). GPC: Mn=1900, PDI=1.8.

Formulation for Spin-Coating

MeGPPCS was dissolved in PGMEA to afford a ten wt %, on a solids basis, relative to the solvent. t-Butylphenyldiphenylsulfonium perfluorobutanesulfanate (TAG) was added such that the composition of TAG relative to polymer was 2.5 wt. %. Surfactant (FC430) was added to constitute 1,500 parts per million (ppm) relative to the total mass. A film with a thickness of 215 nm was spin coated on 25 mm wafer at 3,000 rpm for 40 seconds, and baked at 110° C. for 60 seconds. Optical properties (193 nm): n=1.674, k=0.025. Cross-linking was accomplished by baking the wafer at 220° C. for 60 seconds resulting in a film that was insoluble in any solvents.

(MeGP-co-Me2)PCS copolymer was dissolved in PGMEA to afford a ten wt. %, on a solids basis, relative to the solvent. TAG (tbutylphenyldiphenylsulfonium perfluorobutanesulfanate) was added such that the composition of TAG relative to polymer was 2.5 wt. %. Surfactant (FC430) was added to constitute 1,500 ppm relative to the total mass. A 300 nm thick film was spin coated on a 25 mm wafer at 3,000 rpm for 40 seconds and baked at 110° C. for an additional 60 seconds. Optical properties (193 nm): n=1.681, k=0.032. Cross-linking was effected by heating at 220° C. for 60 seconds.

Branched MeGPPCS was dissolved in PGMEA to afford a ten wt. % on a solids basis, relative to the solvent. TAG (tbutylphenyldiphenylsulfonium perfluorobutanesulfanate) was added such that the composition of TAG relative to polymer was 2.5 wt %. Surfactant (FC430) was added to constitute 1,500 ppm relative to the total mass. A film with a thickness of 118 nm was spin coated on a 25 mm wafer at 3,000 rpm for 40 seconds, and baked at 110° C. for 60 seconds. Cross-linking was effected by heating at 220° C. for 60 seconds. Optical properties (193 nm): n=1.750, k=0.084.

What is claimed is:

1. A method for processing a semiconductor device, the method comprising the steps of:
   providing a material layer on a substrate;
   forming an antireflective hardmask layer over the material layer, wherein the antireflective hardmask layer comprises:
     a carbosilane polymer backbone comprising at least one chromophore moiety and at least one transparent moiety; and
     a crosslinking component;
   utilizing said antireflective hardmask layer in a lithographic process to pattern the material layer; and
   removing substantially all of said antireflective hardmask layer.

2. The method of claim 1, wherein the antireflective hardmask layer further comprises an acid generator.

3. The method of claim 1, wherein the carbosilane polymer backbone comprises SiO-containing units.

4. The method of claim 1, further comprising the steps of:
   forming a radiation-sensitive imaging layer over the antireflective hardmask layer;
   patternwise exposing the radiation-sensitive imaging layer to radiation thereby creating a pattern of radiation-exposed regions in the imaging layer;
   selectively removing portions of the radiation-sensitive imaging layer and the antireflective hardmask layer to expose portions of the material layer; and
   etching the exposed portions of the material layer, thereby forming a patterned material feature on the substrate.

5. The method of claim 4, further comprising the step of removing remaining radiation-sensitive imaging layer from the material layer.

6. The method of claim 4, wherein the radiation is ultraviolet radiation having a wavelength of less than or equal to about 200 nanometers.

7. The method of claim 4, wherein the radiation is electron beam radiation.

8. The method of claim 1, wherein the material layer comprises a material selected from the group consisting of a conductive material, a semiconductive material, a magnetic material, an insulative material, a metal, a dielectric material and compositions comprising at least one of the foregoing materials.

9. The method of claim 1, wherein the material layer comprises at least one of an oxide, a nitride, a polysilicon and a chrome.

10. The method of claim 1 wherein the antireflective hardmask layer has a thickness of from about 0.03 micrometers to about five micrometers.

11. The method of claim 1, wherein the forming step comprises the step of baking the antireflective hardmask layer.

* * * * *